United States Patent [19]

Melanson et al.

[11] Patent Number: 4,798,972
[45] Date of Patent: Jan. 17, 1989

[54] APPARATUS AND METHOD FOR CAPACITOR COUPLED COMPLEMENTARY BUFFERING

[75] Inventors: Ronald J. Melanson, Sunnyvale; Ji L. Yang, Palo Alto, both of Calif.

[73] Assignee: Digital Equipment Corporation, Maynard, Mass.

[21] Appl. No.: 21,251

[22] Filed: Mar. 3, 1987

[51] Int. Cl.[4] .................. H03K 17/10; H03K 17/687; H03K 19/003; H03K 17/04
[52] U.S. Cl. ..................................... 307/270; 307/544; 307/551; 307/565; 307/448
[58] Field of Search ............... 307/544, 547, 548, 550, 307/551, 564, 565, 446, 448, 450, 581, 584, 318, 246, 270

[56] References Cited

U.S. PATENT DOCUMENTS

| | | | |
|---|---|---|---|
| 4,002,927 | 1/1977 | Nakamura et al. | 307/270 X |
| 4,071,783 | 1/1978 | Knepper | 307/270 |
| 4,458,159 | 7/1984 | Konian | 307/270 |
| 4,521,698 | 6/1985 | Taylor | 307/450 |
| 4,649,295 | 3/1987 | McLaughlin et al. | 307/270 X |
| 4,689,505 | 8/1987 | Ghoshal | 307/270 X |
| 4,694,203 | 9/1987 | Uragami et al. | 307/270 X |

FOREIGN PATENT DOCUMENTS 2607891  9/1976  Fed. Rep. of Germany ...... 307/551

OTHER PUBLICATIONS

R. L. Van Tuyl et al., "High-Speed Integrated Logic With GaAs MESFET's," IEEE Journal of Solid State Circuits, vol. SC-9, No. 5, pp. 269-276.
R. C. Eden et al., "Low Power GaAs Digital ICs Using Schottky Diode-FET Logic," ISSCC Digest of Technical Papers, pp. 68-69.
S. Katsu et al., "A GaAs Monolithic Frequency Divider Using Source Coupled FET Logic," IEEE Electron Device Letters, vol. Ed 1-3, No. 8.

Primary Examiner—Stanley D. Miller
Assistant Examiner—David R. Bertelson
Attorney, Agent, or Firm—Finnegan, Henderson, Farabow, Garrett and Dunner

[57] ABSTRACT

A semiconductor buffer circuit and buffering method for driving capacitive loads that enhances the current sinking and sourcing drive characteristics at times when the input signal is changing. Two transistors are used, a source follower and a current source pull-down, with an input signal applied to the control input of the source follower transistor. The complement of the input signal is capacitively coupled to the control input of the current source pull-down transistor. As a result, changes in the input voltage increase or decrease the conductivity of the current source pull-down transistor, thereby allowing the capacitive load to be charged and discharged more efficiently.

26 Claims, 4 Drawing Sheets

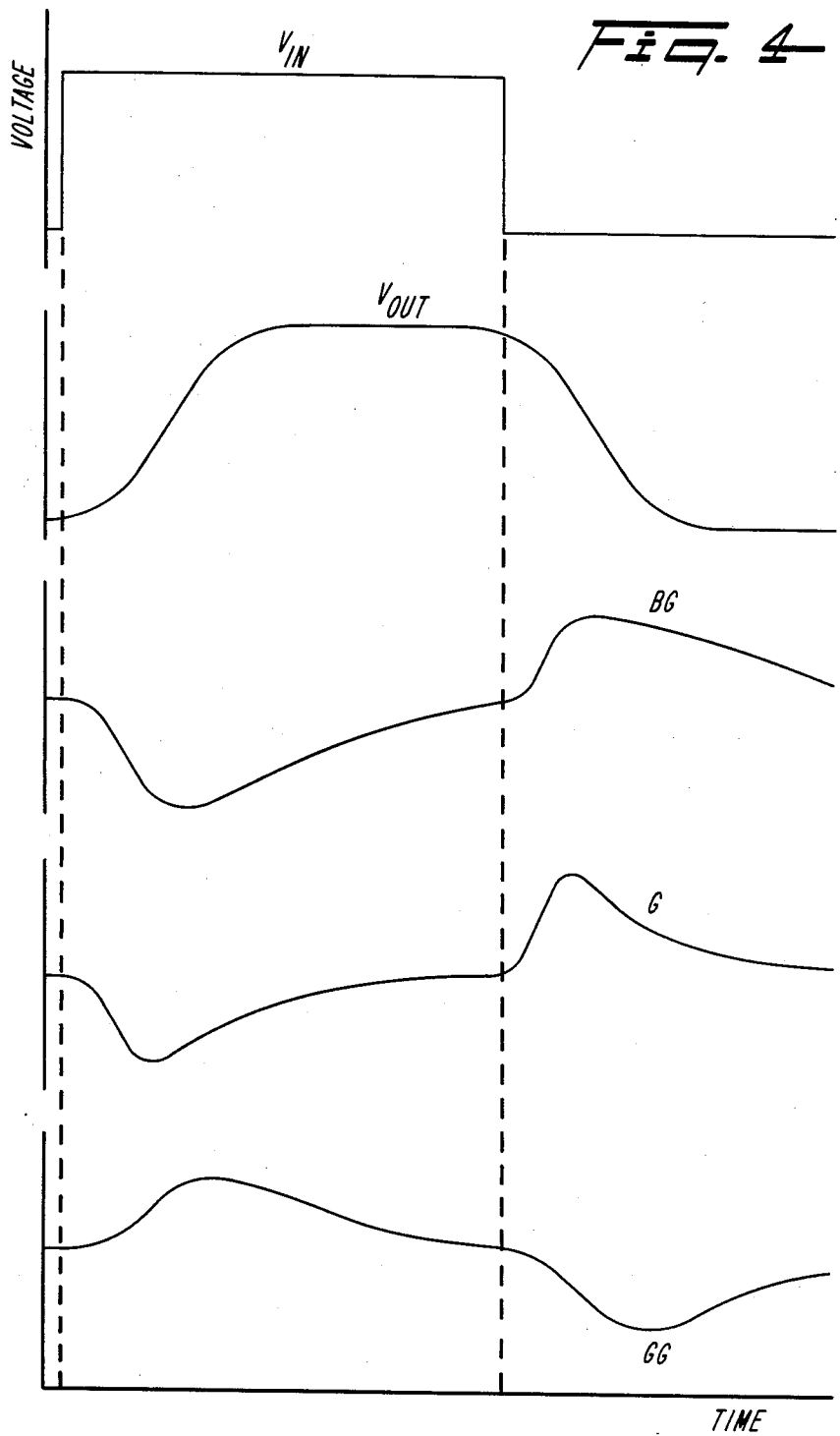

APPARATUS AND METHOD FOR CAPACITOR COUPLED COMPLEMENTARY BUFFERING

FIELD OF THE INVENTION

The present invention relates to semiconductor buffer circuitry, and more particularly to semiconductor buffer circuitry for driving capacitive loads.

BACKGROUND OF THE INVENTION

A buffer is a device included between two stages, an input and a load, which permits signal transfer from the input to the load so that, for example, changes in impedance in one stage have no effect on the performance of the other. Buffer circuits are often used in driving capacitive loads, in which the current at the load leads in phase the voltage at the load. A performance limitation of such buffer circuits is the ability to quickly switch large capacitively loaded networks from one voltage level to another. To achieve fast switching speeds for heavy loads, large source followers with current source pull-downs are usually employed, but they require considerable area and power. These prior art buffer configurations, including memory devices and GaAs MESFET (METAL SEMICONDUCTOR FIELD-EFFECT TRANSISTOR) integrated circuits, appear in several logic forms. For example, BFL (BUFFERED FET LOGIC) is described in R. Van Tuyl and C. Liechti, "High-Speed Integrated Logic with GaAs MESFET's", IEEE Journal of Solid-State Circuits, Vol. SC-9, No. 5, October 1974; SDFL (SCHOTTKY DIODE FET LOGIC) is described in R. Eden, B. M. Welch, and R. Zucca, "Low Power GaAs Digital ICs Using Schottky Diode-FET Logic", ISSCC Digest of Technical Papers, p. 68, Feb. 15, 1978; and SCFL (SOURCE COUPLED FET LOGIC) is described in S. Katsu, S. Nambu, S. Shimano, and G. Kano, "A GaAs Monolithic Frequency Divider Using Source Coupled FET Logic", IEEE Electron Device Letters, Vol. Ed 1-3, No. 8, August 1982. In these logic forms, the principal components of each buffering element are two depletion mode MESFETs (which depending on the logic form may also include level shifting diodes) comprising a source follower and a current source pull-down. These buffers are designed using two MESFETs with channels having sufficient width to drive a load capacitance. A limitation to this design, however, is that large MESFETs are required for large loads, thus utilizing high static power and taking up significant area on the chip.

SUMMARY OF THE INVENTION

The use of the semiconductor buffer circuitry of the present invention, referred to as a Capacitor-Coupled-Complementary-Buffer, achieves several advantages. First, it is significantly faster than the typical buffers described above. Second, if there is no need to improve performance over the buffers used in common practice, the capacitor-coupled complementary buffer can be used to significantly decrease the power dissipation and/or reduce the chip area associated with the buffer. Third, the capacitor-coupled-complementary buffer can provide a voltage gain greater than unity for small capacitive loads, thus providing a stage of AC gain. Fourth, the buffer can be designed to optimize these advantages by trading off switching speed for improvements in power dissipation and buffer size. Fifth, the capacitor-coupled-complementary-buffer provides especially good results in solving the problems associated with driving highly capacitive memory word lines.

Based upon both computer simulation and experimental results, the present invention has been demonstrated to be significantly faster than traditional buffers at little or no increase in chip area or power. Experimentally, ring oscillators have been fabricated using a GaAs depletion-mode MESFET technology. The ring oscillators used twelve stages, where eleven were inverting and one was non-inverting. A long length of interconnect connected the stages, resulting in approximately 250 femtofarads of capacitance at the output of each buffer. The static current for each buffer was 720 microamps. Ring oscillator frequencies were measured to characterize the performance of the circuit of the present invention. Then, using a laser cutter, the circuit was modified to be equivalent to a traditional buffer. The frequency of a ring oscillator built in accordance with the present invention corresponded to gate delays of only 438 ps, whereas the same ring oscillator with buffers built in accordance with common practice had equivalent gate delays of 688 ps.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, there is provided a semiconductor buffer circuit responsive to a digital input signal for driving a capacitive load to one of two binary states, comprising: first transistor means having a first, second, and control electrode, the first electrode coupled to a first reference potential and the second electrode adapted to be coupled to the capacitive load, for charging the capacitive load by current from the first reference potential through the first transistor means at times when the input signal is changing to a high level; second transistor means having a first, second, and control electrode, the first electrode coupled to a second reference potential lower than the first reference potential and the second electrode adapted to be coupled to the capacitive load, for discharging the capacitive load by current to the second reference potential through the second transistor means at times when the input signal is changing to a low level; first coupling means for coupling the digital input signal to the control electrode of the first transistor means, for applying a voltage to the control electrode that increases the current between the first and second electrodes of the first transistor means at times when the input signal is changing to a high level, and decreases the current at times when the input signal is changing to a low level; and second coupling means for coupling the digital input signal to the control electrode of the second transistor means, for applying a voltage to the control electrode that decreases the current between the first and second electrodes of the second transistor means at times when the input signal is changing to a high level, and increases the current at times when the input signal is changing to a low level.

The accompanying drawings which are incorporated in and constitute a part of the specification, illustrate embodiments of the invention and, together with the description, serve to explain the principles of the invention.

BRIEF DESCRIPTION OF THE DRAWINGS

FIG. 4 is a timing diagram of the driver of FIG. 3.

DETAILED DESCRIPTION OF THE PREFERRED EMBODIMENTS

The present invention is described by first analyzing the structure and operation of a typical buffering circuit, prior to discussing the circuitry of the present invention.

Figure 1:
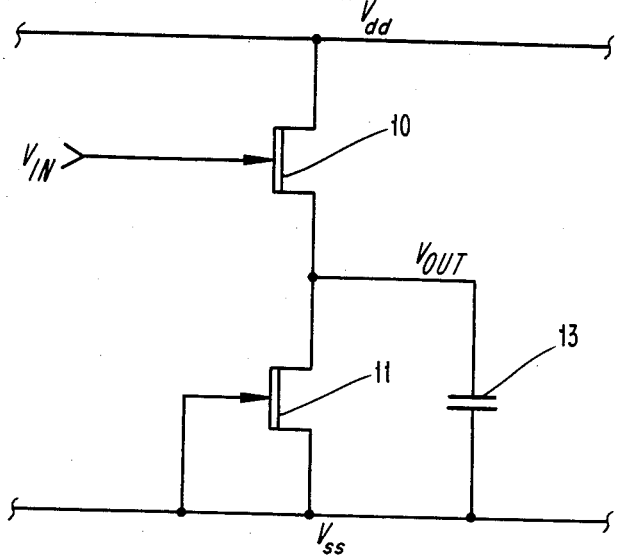
FIG. 1 is a schematic diagram of a typical prior art buffer.

Referring to FIG. 1, a standard source follower buffer used in the prior art is depicted. A first and second transistor means, such as source follower transistor 10 and current source transistor 11, each have a first, second, and control electrode. The voltage applied to the control electrode of each transistor, also referred to as the transistor gate or base, determines the amount of current flowing between the first and second electrodes, also referred to as the transistor source/drain or emitter/collector. The first electrode of each transistor is coupled to a different reference potential, such as $V_{dd}$ (typically zero volts) and $V_{ss}$ (typically a negative voltage). The second electrodes of transistor 10 and 11 are tied together and are adapted to be coupled to a capacitive load 13. A first coupling means exists for coupling a digital input signal $V_{in}$ to the control electrode of transistor 10. The control electrode of transistor 11 is directly connected to the reference potential $V_{ss}$.

It is common practice for the widths of the channels of source follower transistor 10 and current source transistor 11 to be equal, typically 10 microns, as will be explained below. When depletion mode field effect transistors are used, transistor 11 is "on" and its transistor channel is conductive, because the gate of current source transistor 11 is tied to its source, so that the voltage drop $V_{gs}$ always equals zero volts. The steady state current through the channel of transistor 11 to the reference potential $V_{ss}$ is a function of $V_{gs}$ and therefore is maintained at a fixed value, referred to as Idss. For transistor 10, the current between its source and drain in steady state is an independent function and determines the voltage drop $V_{gs}$ between its gate and source. Assuming that the source follower transistor 10 is designed to have a channel of equal width to the channel of transistor 11, then the steady state current through the channel of source follower 10 from reference potential $V_{dd}$ will be Idss as well, independent of the swing in the input voltage, typically 1.5 volts, applied to the control electrode, or gate, of source follower 10. By designing transistor 10 so that the current through it is maintained at Idss in steady state, this necessarily causes the voltage drop $V_{gs}$ in steady state to always equal zero volts. Hence, the voltage output at the transistor 10 source follows precisely the input voltage on the gate of transistor 10. If the widths of the channels of the two transistors are designed to be unequal, then the voltage drop $V_{gs}$ for transistor 10 is a temperature-dependent function. This describes the DC operating conditions for typical prior art buffers, and similar considerations apply when enhancement mode, bipolar, or other components are used. However, the AC characteristics when a load represented by capacitor 13 is placed at the output of the buffer are of the greatest interest because of the inefficient manner in which the load is charged and discharged.

The analysis of the typical capacitively loaded buffer requires an examination of the nature of the charging and discharging currents to and from capacitor 13. The maximum current available to discharge capacitor 13 at times when the input voltage is switching from a high to a low level is Idss, which is the steady state current through current source transistor 11 for a voltage drop $V_{gs}$ equal to zero volts. The entire current is used solely to discharge capacitor 13 at first. This is because the fall time of the input voltage at the control electrode of source follower 10 is faster than the change in voltage output at the source of transistor 10 due to the capacitive load, thereby reducing the value of $V_{gs}$. As a result, source follower 10 gets cut off and becomes non-conductive, making the entire current Idss through transistor 11 to reference potential $V_{ss}$ available to discharge capacitor 13. However, the entire current Idss will not be available for the entire discharge time. Source follower 10 has a source voltage that decreases as the output voltage on capacitive load 13 is discharged, thereby causing the transistor 10 source voltage to approach the gate voltage and increasing $V_{gs}$, thus turning transistor 10 on. This happens during the latter part of the discharge of load capacitor 13, slowing down the discharge of the load.

Conversely, the maximum current available to charge capacitor 13 when the input voltage switches from a low to a high level is a function of the "overdrive" impressed on the control electrode of source follower 10, minus any current flowing through transistor 11, which remains fixed at Idss. The overdrive is due to the increased voltage drop from the gate to source of source follower 10: the voltage on the control electrode, or gate, responds quickly to the input signal and leads any increase in output voltage at the transistor 10 source (due to capacitive load 13). The overdrive results in a significant increase of current from $V_{dd}$ through source follower 10 above the steady state current Idss flowing through transistor 11 to $V_{ss}$, thus charging load capacitor 13. However, the current Idss through transistor 11 subtracts directly from the maximum possible charging current from $V_{dd}$ available at the source of transistor 10. Furthermore, as load capacitor 13 charges, the transistor 10 source voltage begins to match the gate voltage, decreasing $V_{gs}$, and the overdrive of source follower 10 will decrease.

Figure 2A:
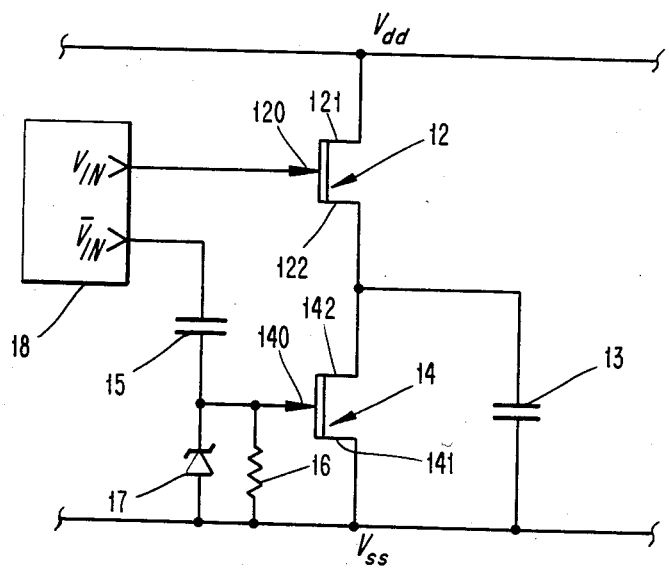
FIG. 2A is a schematic diagram of a buffer circuit in accordance with one embodiment of the present invention.
Figure 2B:
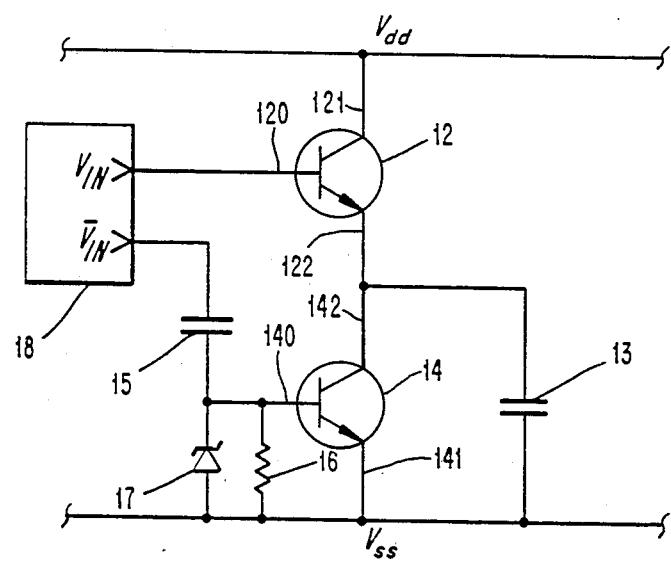
FIG. 2B is a schematic diagram of a buffer circuit in accordance with another embodiment of the present invention.

The present invention significantly improves the charging and discharging of capacitive loads over those of traditional buffers, resulting in greatly improved performance by increasing the available current at times when the digital input signal is changing. In FIG. 2, the detailed schematic of an embodiment of the invention is depicted.

In accordance with the invention, the buffer circuit is responsive to a digital input signal for driving a capacitive load to one of two binary states. The buffer circuit includes a first transistor means having a first, second, and control electrode, and a second transistor means having a first, second, and control electrode. As embodied herein, the first and second transistor means are a source follower transistor 12 and a switched pulldown transistor 14.

The control electrode of a bipolar transistor is commonly referred to as the base, whereas the control electrode of a field effect transistor is commonly referred to as the gate. It is the intent of this disclosure in using the terms gate, drain, and source to refer both to field effect transistors and to the base, collector, and emitter, respectively, of bipolar transistors, and to refer to both n- and p-channel devices. The symbols used to depict transistors in the drawings are not intended to represent only a single type of transistor.

In accordance with the invention, the first transistor means has its first electrode 121 coupled to a first reference potential, preferably $V_{dd}$, and its second electrode 122 adapted to be coupled to load 13. As a result, load 13 is charged by current from the first reference potential through the first transistor means at times when the input signal is changing to a high level.

In accordance with the invention, the second transistor means has its first electrode 141 coupled to a second reference potential, preferably $V_{ss}$, and its second electrode 142 adapted to be coupled to load 13. As a result, load 13 is discharged by current to the second reference potential, which is lower than the first reference potential, through the second transistor means at times when the input signal is changing to a low level.

In accordance with the invention, the digital input signal is coupled to the control electrode of the first transistor means by a first coupling means, and to the control electrode of the second transistor means by a second coupling means. The voltage applied by the first coupling means to the control electrode of the first transistor means increases the current between the first and second electrodes of the first transistor means at times when the input signal is changing to a high level and decreases that current at times when the input signal is changing to a low level. The second transistor means operates in a similar manner, except the current through the second transistor means to the second reference potential is increased by the voltage applied to its control electrode when the input signal is changing to a low level, and is decreased by the voltage applied when the input signal is changing to a high level.

As embodied in FIG. 2, two complementary input voltage levels are required. Vin is the digital input signal and is applied from input signal source 18 to the control electrode 120 of source follower transistor 12, or the first transistor means, by the first coupling means, preferably a conductive line.

As embodied herein, the complement of the digital input signal is capacitively coupled to the control electrode 140 of switched pull-down transistor 14, which is preferably a MESFET, by the second coupling means, preferably a coupling capacitor 15. Preferably, the second coupling means includes capacitor 15 coupled to the control electrode of the second transistor means, and a means for applying the complement of the digital input signal to capacitor 15, such as a conductive line that is connected to input signal source 18. In an alternate embodiment, the buffer circuit can include an inverter that is coupled to the digital input signal for applying the complement of the digital input signal to capacitor 15. For the reasons discussed earlier with respect to FIG. 1, for field effect transistors, it is preferable to design the channel of switched pull-down transistor 14, or the second transistor means, to be the same size as the channel of source follower transistor 12, or the first transistor means.

In accordance with the invention, the voltage applied to the control electrode of the second transistor means makes transitions in the opposite direction to the voltage applied to the control electrode of the first transistor means. This results in complementary operation of the two transistor means at times when the input signal is changing between its two binary states.

The voltage applied to the control electrode of the first and second transistor means at times when the input signal is changing controls the amount of current flowing between the first and second electrodes in each of the two transistor means. As embodied herein, source follower 12 charges load 13 during a positive transition of Vin (Vin switching from a low to a high level) with an increased current flowing from $V_{dd}$ through transistor 12 because of the increased voltage drop Vgs. Pull-down transistor 14 is preferably cut off due to a negative transition of the complement of Vin applying a lower voltage to the control electrode of transistor 14, decreasing the voltage drop $V_{gs}$ from gate to source and thereby decreasing the current flow to $V_{ss}$ through transistor 14. Hence, more current is available to charge capacitive load 13 than in the circuit shown in FIG. 1 because less current is diverted to the second reference potential through the transistor 14.

Conversely, the pull-down transistor has a positive voltage applied to its control electrode during positive transitions of the complement of Vin (when Vin is changing from a high to a low level), resulting in an increase in $V_{gs}$ that enables increased current to flow through transistor 14 to $V_{ss}$, with the discharging current being several times higher than the steady state current Idss through a current source transistor 11 as shown in FIG. 1 having a control electrode that is not capacitively coupled to the input signal. The increased current between the first and second electrodes of transistor 14 causes capacitive load 13 to be discharged to the second reference potential more quickly during the negative transition in Vin.

Although the present invention has greatly improved AC characteristics over a typical buffer, the static power dissipation can be chosen to be approximately the same as that of a typical buffer when the first and second transistor means are of equal size to the first and second transistor means used in a typical buffer. As embodied herein, this is achieved using a transistor control coupling means. Preferably, a resistor 16, which is a discharge resistor, is connected to coupling capacitor 15 so that it can be discharged to the second reference potential. The value of resistor 16 is selected such that the voltage drop Vgs between the transistor gate and source is substantially equal to zero volts for transistor 14 shortly after the voltage output on the load reaches a desired predetermined value approximately equal to either one of the two binary states. As discussed previously, a voltage drop $V_{gs}$ of zero volts in the case of a depletion mode field effect transistor of similar size to transistor 11 in FIG. 1 results in a fixed value of Idss for the steady state current between the first and second electrodes of the second transistor means. In that case, the steady state voltage drop Vgs of zero volts on transistor 14 also results in the circuit having a unity voltage gain, so that the output voltage on load 13 will be approximately equal to Vin. The fixed value of Idss is a predetermined value selected by the circuit designer in order to design a circuit having particular performance, power, and size characteristics.

As embodied herein, the voltage applied to the control electrode at the second transistor means is clamped to prevent it from exceeding desired levels selected by the circuit designer. Preferably, the maximum amplitude of the signal capacitively coupled to the control electrode of transistor 14 is one diode drop (approximately 0.7 v) above and below $V_{ss}$. In the positive direction, transistor 14 itself acts as a clamp. As embodied herein, in the negative direction, a diode means, preferably the Schottky diode 17, clamps the voltage applied to the control electrode.

Preferably, the value of coupling capacitor 15 is chosen so that the amplitude of the voltage applied to the control electrode of transistor 14 at times when the input signal is changing is sufficient to significantly increase the current between the first and second electrodes during discharge of the load, and to cut off that current during charging of the load.

For a buffer circuit as shown in FIG. 2, typical values are: 10 microns for transistors 12 and 14, 2 microns for diode 17, 6K ohms for resistor 16, 50 femtofarads for capacitor 15, zero volts for $V_{dd}$, and $-3.5$ volts for $V_{ss}$.

Figure 3:
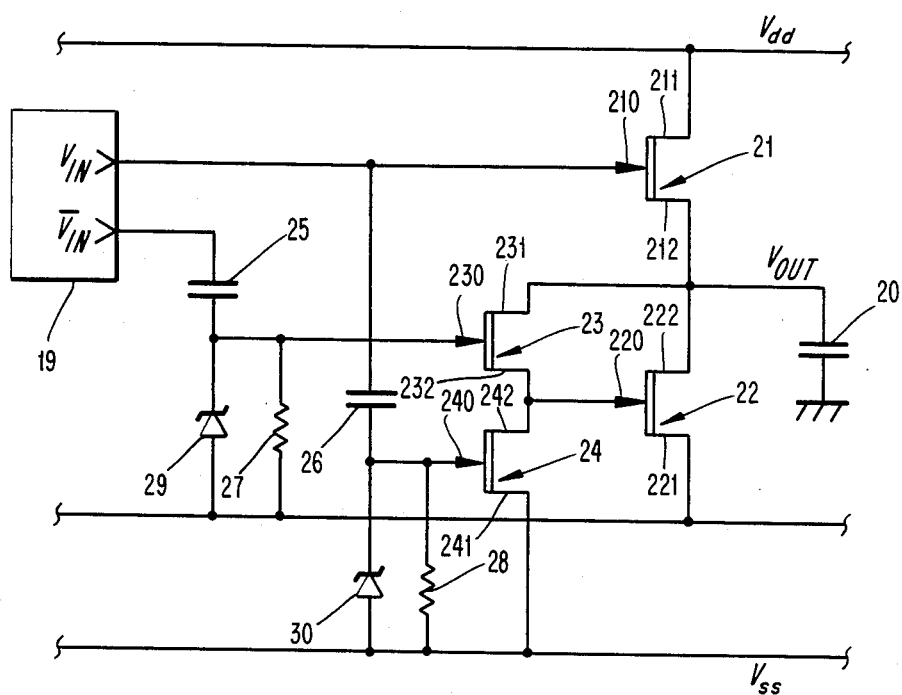
FIG. 3 is a schematic diagram of a memory word line driver utilizing a modified embodiment of the invention.

Another aspect of the invention is shown in FIG. 3. The present invention has been extended to more complex forms of buffering for specific applications, such as memory word line drivers. Memory word line drivers present a unique problem that the invention has improved significantly, especially as memory size increases. Memories are organized as an array of memory cells, with each word line driving the gates for a row of memory cells. Memory word lines are highly capacitive, with a load of up to several picofarads (typically 3 pfd) that can take several nanoseconds to set. However, it is a design goal to drive these long lines in the shortest amount of time with a minimum amount of power dissipation and chip area. The word line driver shown in FIG. 3 achieves excellent performance, increasing speed by a factor of two with minimum changes in power and area, using two stages of buffering. Alternately, performance can be kept constant by appropriately adjusting the values of the coupling capacitors and discharge resistors, while the size of the transistors is cut in half, thereby improving the power dissipation of the buffer by a factor of two.

In FIG. 3, the word line being driven acts as a load capacitance 20. In accordance with this aspect of the invention, the digital input signal from input signal source 19 is applied by a first coupling means, preferably a conductive line, to the control electrode of the first transistor means, such as source follower transistor 21. The second transistor means, such as switched pull-down transistor 22, is capacitively coupled by its control electrode to the complement of the digital input signal by a second coupling means, preferably an additional stage of buffering. The first electrode 211 of the first transistor means is coupled to a first reference potential, such as $V_{dd}$, and the second electrode 212 is adapted to be coupled to the memory word line, for charging the word line by current from the first reference potential. The first electrode 221 of the second transistor means is coupled to a second reference potential, such as $V_T$, and the second electrode 222 is adapted to be coupled to the word line, for discharging the word line by current to the second reference potential. The currents that charge and discharge word line 20 at times when the input signal is changing flow between the first and second electrodes of transistors 21 and 22.

Similar to the circuit shown in FIG. 2, current between the first and second electrodes of transistor 21 is increased at times when the input signal is changing to a high level and is decreased when the input signal is changing to a low level due to the applying of a higher voltage to the control electrode 210 to increase the current and a lower voltage to decrease the current. As a result, memory word line 20 is charged by current from Vdd (typically zero volts) at times when the input signal is changing to a high level.

As embodied herein, the control electrode 220 of pull-down transistor 22 is connected to the complement of the input signal from input signal source 19 through the second coupling means. Preferably, the signal source and the control electrode are not directly connected by a capacitor. As embodied herein, the complement of the input signal is capacitively coupled to the control electrode 230 of a third transistor means, such as transistor 23, by a fourth coupling means, such as capacitor 25, and the input signal is capacitively coupled to the control electrode 240 of a fourth transistor means, such as transistor 24, by a third coupling means, such as capacitor 26.

As embodied in FIG. 3, the third and fourth transistor means are provided in order to compensate for negative feedback and reduce the effective input capacitance at the control electrode of transistor 22, thereby making it easier for source 19 to provide a signal capable of driving the control electrode of the second transistor means. The large capacitive load 20 and the negative feedback at the control electrode of transistor 22 due to the Miller effect result in the effective input capacitance at the transistor 22 control electrode being relatively large. The effective capacitance at the control electrode is related to the sum of the swings in voltage on the gate and drain of transistor 22. Whereas the drain 211 of transistor 21 is coupled to a fixed voltage, the drain 222 of transistor 22 is adapted to be coupled to the load, increasing the negative feedback opposing switching of transistor 22 at times when the input signal is changing. As a result, the input capacitance at the control electrode can be approximately two times higher for transistor 22 than for transistor 21. The addition of transistors 23 and 24, accompanied by a scaling down of the size of their respective transistor channels, reduces the amount of signal at source 19 needed to drive the transistor 22 control electrode, making the input capacitance of the buffer circuit at the point where the complement of the input signal is applied less than or equal to the input capacitance at the point where the input signal is applied to the control electrode of transistor 21. The added stage of transistors 23 and 24 increases the gate delay of the buffer circuit by only a small amount. Use of transistors 23 and 24 for pre-buffering aids in matching impedance between the buffer input and output, with the impedance being smaller at the control electrodes of transistors with smaller channels. As embodied herein, transistors 23 and 24 have channels with similar widths, and these widths can typically be approximately one-third of the width of transistors 21 and 22 in order to minimize steady state power dissipation.

As embodied herein, transistors 23 and 24 have channels through which current can flow in order to raise or lower the voltage applied to the control electrode of the second transistor means. The first electrode 231 of the transistor 23 is operatively coupled to raise the voltage applied to the control electrode of the second transistor means at times when the input signal is changing to a low level. For example, electrode 231 can be coupled to the first reference potential, preferably $V_{dd}$ (typically zero volts). The first electrode of the transistor 22 is coupled to the second reference potential, preferably $V_T$ (typically $-3.5$ volts), and the first electrode 241 of transistor 24 is coupled to a third reference potential, preferably $V_{ss}$ (typically $-5.2$ volts). The second electrodes 232 and 242 of the third and fourth transistor means are coupled to the control electrode of the second transistor means, thereby raising and lowering the voltage applied to the control electrode at times when the input signal is changing.

Preferably, the digital input signal is coupled to the control electrode of transistor 24, which has a voltage applied to it as shown by curve GG in the computer simulation timing diagram of FIG. 4, by the third coupling means, such as coupling capacitor 26. This causes the current between the first and second electrodes of transistor 24 to increase at times when the input signal is changing to a high level, and to decrease at times when the input signal is changing to a low level. The increased current to the third reference potential at times when the input signal is changing to a high level lowers the voltage applied to the control electrode of transistor 22, as shown by curve BG in FIG. 4, thereby decreasing the current between the first and second electrodes of transistor 22.

Preferably, the complement of the digital input signal is coupled to the control electrode of transistor 23, resulting in the waveform shown by curve G in FIG. 4, by the fourth coupling means, such as coupling capacitor 25. This causes the current between the first and second electrodes of transistor 23 to increase at times when the input signal is changing to a low level, and to decrease at times when the input signal is changing to a high level. The increased current from, for example, the memory word line or the first reference potential at times when the input signal is changing to a low level raises the voltage applied to the control electrode of transistor 22, as shown by curve BG in FIG. 4, thereby increasing the current between the first and second electrodes of transistor 22.

As embodied herein, the memory word line is discharged by current to the second reference potential through transistor 22. Therefore, because of the capacitive coupling of the digital input signal to transistor 24, and the capacitive coupling of the complement of the input signal to transistor 23, the current through transistor 22 discharging the word line load 20 increases at times when the input signal is changing to a low level and decreases at times when the input signal is changing to a high level.

The third reference potential $V_{ss}$ is lower than the second reference potential $V_T$, and the selected values are determined based on a trade-off analysis. The third reference potential must be low enough to ensure that voltage applied to the control electrode of transistor 22 sufficiently decreases or cuts off the current in transistor 22. Assuming transistor 22 is a depletion mode field effect transistor, then a third reference potential that is as high as $V_T$ coupled to the transistor 22 control electrode clearly will cause $V_{gs}$ to equal zero volts even when the input signal is changing to a low level and will not decrease the current in transistor 22 below the steady state value. This dictates a higher potential for $V_T$ than for $V_{ss}$. The power dissipation should be minimized as well. A higher potential for $V_T$ and $V_{ss}$ lowers the potential drop across the channels of the transistor means, thereby decreasing the power used.

In the embodiment shown in FIG. 3, first and second discharge resistance means, preferably resistors 27 and 28, couple each of the third and fourth transistor means, respectively, to selected reference potentials. These resistors allow coupling capacitors 25 and 26, respectively, to be discharged after a transition in the input signal has occurred. The resistance values are chosen so that the voltages applied to the control electrodes of transistors 23 and 24 will reach selected values at times when the input signal is not changing. The selected voltages maintain a desired steady state current through transistors 23 and 24 that determines the voltage applied to the control electrode of transistor 22. When the voltage output on the load 20 is approximately equal to one of the two binary states, the steady state voltage applied to the control electrode of transistor 22 and shown in curve BG of FIG. 4 causes the steady state current through transistor 22 to have a fixed valve of $I_{dss}$, similar to the situation described with respect to FIG. 2.

First and second diode means, preferably Schottky diodes 29 and 30, in combination with their respective transistors 23 and 24, act as clamps that prevent the signal being coupled to the transistor control electrodes from swinging beyond a desired range at times when the input voltage is changing.

The circuit shown in FIG. 3 is improved by adapting the first electrode of transistor 23 to be coupled to memory word line load 20, instead of to the first reference potential. This improvement is typically accompanied by an increase in the size of transistor 21. As a result of this modification, when the input signal is changing to a low level, the increased current through transistor 23 is supplied by load 20. This more effectively discharges the memory word line from a high to a low level by discharging it through both transistors 22 and 23. Additionally, the power dissipated in steady state through transistors 23 and 24 is utilized more efficiently, because it is provided by load 20 rather than being supplied to $V_{ss}$ directly from the first reference potential.

For a buffer circuit as shown in FIG. 3, typical values are: 30 microns for transistor 21, but 40 microns with the first electrode of transistor 23 connected to load 20 rather than to $V_{dd}$, 30 microns for transistor 22; 10 microns for transistors 23 and 24; 2 microns for diodes 29 and 30; 5K ohms for resistors 27 and 28; 50 femtofarads for capacitors 25 and 26; 3 picofarads for memory word line load 20; zero volts for $V_{dd}$, $-3.5$ volts for $V_T$, $-5.2$ volts for $V_{ss}$; and $-0.75$ volts to $-2.25$ volts for the digital input signal.

The circuit shown in FIG. 3 can also be improved by connecting coupling capacitor 26 to memory word line load 20 rather than to the digital input signal. This circuit functions in a similar fashion because the voltage at the second electrode of the transistor 21 will track (follow) the voltage at the control electrode of the transistor. Therefore, the voltage input to the control electrode of transistor 24 undergoes the same transitions as the digital input signal $V_{in}$.

The present invention approach is not limited to GaAs MESFETs, although that is the preferred embodiment. This approach can be used for silicon devices and for JFETs (Junction FETS), and also has applications with bipolar circuits, such as emitter followers. Similarly, enhancement rather than depletion mode transistors can be used with appropriate modifications to the circuitry.

It will be further apparent to those skilled in the art that various modifications and variations can be made to the instant invention without departing from the scope or spirit of the invention, and it is intended that the present invention cover the modifications and variations provided that they come within the scope of the appended claims and their equivalents.

What is claimed is:

1. A semiconductor buffer circuit responsive to a digital input signal for driving a capacitive load to one of two binary states, comprising:

first transistor means having a first, second, and control electrode, the first electrode coupled to a first reference potential and the second electrode to be coupled to the capacitive load, for charging the capacitive load by current from the first reference potential through the first transistor means at times when the input signal is changing to a high level;

second transistor means having a first, second, and control electrode, the first electrode coupled to a second reference potential lower than the first reference potential and the second electrode to be coupled to the capacitive load, for discharging the capacitive load by current to the second reference potential through the second transistor means at times when the input signal is changing to a low level;

first coupling means for coupling the digital input signal to the control electrode of the first transistor means, for applying a voltage to the control electrode that increases the current between the first and second electrodes of the first transistor means at times when the input signal is changing to a high level, and decreases the current at times when the input signal is changing to a low level; and second coupling means for capacitively coupling the digital input signal to the control electrode of the second transistor means, for applying a voltage to the control electrode that decreases the current between the first and second electrodes of the second transistor means at times when the input signal is changing to a high level, and increases the current at times when the input signal is changing to a low level.

2. A buffer circuit in accordance with claim 1, in which the second coupling means comprises:
 a capacitor coupled to the control electrode of the second transistor means; and
 means for applying the complement of the digital input signal to said capacitor.

3. A buffer circuit in accordance with claim 2, in which the first and second transistor means comprise field effect transistors.

4. A buffer circuit in accordance with claim 2, in which the first and second transistor means comprise junction field effect transistors.

5. A buffer circuit in accordance with claim 2, in which the first and second transistor means comprise bipolar transistors.

6. A buffer circuit in accordance with claim 2, and further comprising:
 transistor control coupling means for coupling the control electrode of the second transistor means to the second reference potential, for applying a voltage to said control electrode that maintains the current between the first and second electrodes of the second transistor means at a predetermined value at times when the input signal is not changing.

7. A buffer circuit in accordance with claim 6, wherein the second transistor means is a depletion mode transistor, in which the transistor control coupling means comprises:
 a resistor having a selected resistance value such that the voltage drop across the resistor is substantially equal to zero except at times when the input signal is changing.

8. A buffer circuit in accordance with claim 2, and further comprising:
 diode means coupling the control electrode of the second transistor means to the second reference potential and operative to clamp the voltage applied to said control electrode.

9. A buffer circuit in accordance with claim 2, in which the buffer circuit drives a memory word line.

10. A buffer circuit in accordance with claim 2, in which the semiconductor buffer circuit is comprised of gallium arsenide.

11. A buffer circuit in accordance with claim 2, in which the semiconductor buffer circuit is comprised of silicon.

12. A buffer circuit in accordance with claim 3, in which the transistors comprise depletion mode transistors.

13. A method for driving a capacitive load to one of two binary states responsive to a digital input signal, wherein a first potential is coupled to the capacitive load by means of a first transistor, and a second potential lower than the first potential is coupled to the capacitive load by means of a second transistor, comprising the steps of:

coupling the digital input signal to a control electrode of the first transistor, to apply a first voltage to said control electrode for increasing the amount of current charging the capacitive load from the first reference potential at times when the input signal is changing from a low to a high level, and to apply a second voltage lower than the first voltage to said control electrode for decreasing the amount of charging current at times when the input signal is changing from a high to a low load; and capacitively coupling the complement of the digital input signal to a control electrode of the second transistor, to apply the first voltage to said control electrode for increasing the amount of current discharging the capacitive load to the second reference potential at times when the input signal is changing from a high to a low level, and to apply the second voltage to said control electrode for decreasing the amount of discharging current at times when the input signal is changing from a low to a high level.

14. A method for driving a capacitive load in accordance with claim 13, and further comprising the step of:
 clamping the maximum amplitude of the signal coupled to the control electrode of the second transistor.

15. A method for driving a capacitive load in accordance with claim 13, in which:
 the step of capacitively coupling the complement of the digital input signal for decreasing the discharging current to the second reference potential at times when the input signal is changing from a low to a high level is operative to cut off the second transistor.

16. A method for driving a capacitive load in accordance with claim 13, in which:
the step of coupling the digital input signal for decreasing the charging current from the first reference potential at times when the input signal is changing from a high to a low level is operative to cut off the first transistor.

17. A buffer circuit responsive to a digital input signal for driving a memory word line, comprising:
first transistor means having a first, second, and control electrode, the first electrode coupled to a first reference potential and the second electrode to be coupled to the memory word line, for charging the memory word line by current from the first reference potential through the first transistor means when the input signal is changing to a high level;
second transistor means having a first, second, and control electrode, the first electrode coupled to a second reference potential lower than the first reference potential and the second electrode to be coupled to the memory word line, for discharging the memory word line by current to the second reference potential through the second transistor means when the input signal is changing to a low level;
first coupling means for coupling the digital input signal to the control electrode of the first transistor means, for applying a voltage to the control electrode that increases the current between the first and second electrodes of the first transistor means at times when the input signal is changing to a high level and decreases the current at times when the input signal is changing to a low level; and
second coupling means for capacitively coupling the complement of the digital input signal to the control electrode of the second transistor means, for applying a voltage to the control electrode that decreases the current between the first and second electrodes of the second transistor means at times when the input signal is changing to a high level and increases the current at times when the input signal is changing to a low level.

18. A buffer circuit in accordance with claim 17, in which the second coupling means further comprises:
third transistor means having a first, second, and control electrode, the first electrode operatively coupled to raise the voltage applied to the control electrode of the second transistor means at times when the input signal is changing to a low level and the second electrode coupled to the control electrode of the second transistor means;
fourth transistor means having a first, second, and control electrode, the first electrode coupled to a third reference potential lower than the second reference potential and the second electrode coupled to the control electrode of the second transistor means;
third coupling means for capacitively coupling the digital input signal to the control electrode of the fourth transistor means, for applying a voltage to said control electrode that increases the current between the first and second electrodes of the fourth transistor means at times when the input signal is changing to a high level and decreases the current at times when the input signal is changing to a low level, wherein the increased current to the third reference potential at times when the input signal is changing to a high level lowers the voltage applied to the control electrode of the second transistor means and thereby decreases the current between the first and second electrodes of the second transistor means; and
fourth coupling means for capacitively coupling the complement of the digital input signal to the control electrode of the third transistor means, for applying a voltage to said control electrode that increases the current between the first and second electrodes of the third transistor means at times when the input signal is changing to a low level and decreases the current at times when the input signal is changing to a high level, wherein the increased current into the first electrode of the third transistor means at times when the input signal is changing to a low level raises the voltage applied to the control electrode of the second transistor means and thereby increases the current between the first and second electrodes of the second transistor means;
wherein the current discharging the memory word line increases at times when the input signal is changing to a low level and decreases at times when the input signal is changing to a high level.

19. A buffer circuit in accordance with claim 18, and further comprising:
first discharge resistance means for coupling the control electrode of the third transistor means to the second reference potential; and
second discharge resistance means for coupling the control electrode of the fourth transistor means to the third reference potential.

20. A buffer circuit in accordance with claim 18, and further comprising:
first diode means coupling the control electrode of the third transistor means to the second reference potential for clamping the voltage applied to said control electrode.

21. A buffer circuit in accordance with claim 18, and further comprising:
diode means coupling the control electrode of the fourth transistor means to the third reference potential for clamping the voltage applied to said control electrode.

22. A buffer circuit in accordance with claim 18, in which the buffer circuit is comprised of gallium arsenide.

23. A buffer circuit in accordance with claim 18, in which the transistor means comprise field effect transistors.

24. A buffer circuit in accordance with claim 23, in which the transistor means comprise depletion mode transistors.

25. A buffer circuit in accordance with claim 23, in which a channel in each of the third and fourth transistor means is thinner than a channel in each of the first and second transistor means.

26. A buffer circuit in accordance with claim 17, in which the second coupling means further comprises:
third transistor means having a first, second, and control electrode, the first electrode to be coupled to the memory word line and the second electrode coupled to the control electrode of the second transistor means;
fourth transistor means having a first, second, and control electrode, the first electrode coupled to a third reference potential lower than the second reference potential and the second electrode coupled to the control electrode of the second transistor means;

third coupling means for capacitively coupling the digital input signal to the control electrode of the fourth transistor means, for applying a voltage to said control electrode that increases the current between the first and second electrodes of the fourth transistor means at times when the input signal is changing to a high level and decreases the current at times when the input signal is changing to a low level, wherein the increased current to the third reference potential at times when the input signal is changing to a high level lowers the voltage applied to the control electrode of the second transistor means and thereby decreases the current between the first and second electrodes of the second transistor means; and fourth coupling means for capacitively coupling the complement of the digital input signal to the control electrode of the third transistor means, for applying a voltage to said control electrode that increases the current between the first and second electrodes of the third transistor means at times when the input signal is changing to a low level and decreases the current at times when the input signal is changing to a high level, wherein the increased current from the memory word line at times when the input signal is changing to a low level raises the voltage applied to the control electrode of the second transistor means and thereby increases the current between the first and second electrodes of the second transistor means, and discharges the memory word line through the third transistor means;

wherein the current discharging the memory word line through the second and third transistor means increases at times when the input signal is changing to a low level and decreases at times when the input signal is changing to a high level.

* * * * *